United States Patent [19]

Shima

[11] Patent Number: 5,289,401
[45] Date of Patent: Feb. 22, 1994

[54] ANALOG STORAGE DEVICE FOR ARTIFICIAL NEURAL NETWORK SYSTEM

[75] Inventor: Takeshi Shima, Sagamihara, Japan

[73] Assignee: Kabushiki Kaisha Toshiba, Kawasaki, Japan

[21] Appl. No.: 717,511

[22] Filed: Jun. 19, 1991

[30] Foreign Application Priority Data

Jun. 19, 1990 [JP]   Japan .................. 2-160931

[51] Int. Cl.$^5$ .............................................. H01L 27/00
[52] U.S. Cl. ......................................... 365/45; 365/185
[58] Field of Search ..................... 365/45, 185, 182; 257/394, 402, 202, 203

[56] References Cited

U.S. PATENT DOCUMENTS 5,179,427  1/1993  Nakayama et al. .................. 365/185
5,179,537  1/1993  Matsumoto .......................... 365/185

OTHER PUBLICATIONS

An Electrically Trainable Artificial Neural Network (ETANN) with 10240 "Floating Gate" Synapses, M. Holler, et al., IJCNN 1989.

*Primary Examiner*—Rolf Hille
*Assistant Examiner*—Roy Potter
*Attorney, Agent, or Firm*—Oblon, Spivak, McClelland, Maier & Neustadt

[57] ABSTRACT

An analog storage device employs an electrically erasable programmable transistor as its memory cell. The memory cell transistor has a source and a drain which are disposed spaced apart from each other on a semiconductive substrate to define a channel region therebetween, an insulated floating gate electrode which at least overlaps the channel region, and an insulated control gate electrode disposed above the insulated floating gate electrode. Minority carriers are allowed to tunnel between the channel region and the insulated floating gate. The amount of carriers to be stored on the floating gate electrode is controlled such that it is in proportion to analog data to be stored therein. A variation in the internal field of the transistor which may occur when its floating gate electrode is being charged with minority carriers is monitored. When a field variation is detected, a voltage for compensating for the detected field variation is applied to the control gate electrode, whereby the linearity of analog storage is ensured.

8 Claims, 7 Drawing Sheets

ANALOG STORAGE DEVICE FOR ARTIFICIAL NEURAL NETWORK SYSTEM

BACKGROUND OF THE INVENTION

1. Field of the Invention

The present invention relates to data storage devices and, more particularly, to analog storage devices using transistors of a floating gate electrode structure based on tunnel effect.

2. Description of the Related Art

Neural network systems have wide applicability in various technical fields including automatic recognition systems, such as character recognition systems, voice recognition systems, etc., activation control systems for robots and neuro computer systems incorporating artificial intelligence, and studies thereof have become more and more active recently. In the neural network systems, a storage device, which is capable of temporarily or permanently storing analog information handled in the systems as it is, plays a very important role. This type of storage device is referred to as the "analog memory."

A presently available electrically erasable programmable read only memory (EEPROM) has been employed as such an analog memory. The EEPROM includes an array of memory cells arranged in a matrix of rows and columns. Each cell of the EEPROM has a floating gate tunneling metal oxide semiconductor (FATMOS) field effect transistor. An arbitrary memory cell is individually addressable by applying electric signals to a given row and a given column of the memory array.

Typically, analog information or data to be stored is converted to a voltage signal in pulse form which is modulated in the number of pulses (or pulse width) in accordance with a pulse density modulation system. The storage of such a pulse signal in the EEPROM is performed as follows. Between the control gate electrode of a selected memory cell transistor and one of its current-carrying electrodes is externally applied a suitable electric field for a period of time proportional to the number of modulated pulses (or pulse width) of the signal. The tunnel effect allows a corresponding amount of minority carriers (electrons or holes) to flow into the floating gate electrode, thereby charging the floating gate electrode. Thus, the analog data is stored in (written into) the selected memory cell transistor. This is referred to as the "tunnel injection writing" technique.

A significant problem with the analog storage system using the tunnel injection writing technique is that it is very difficult to accurately charge the floating gate electrode of a memory cell transistor with an amount of electric carriers proportional to analog information to be stored. This difficulty depends mainly on the fact that the amount of minority carriers injected into the floating gate electrode is not a linear function of the field application time. In other words, even if the strength of an externally applied field is held constant, the amount of tunneled carriers to the floating gate will vary exponentially with respect to the field application time.

The nonlinearity of the amount of tunneled carriers is considered to result from the following reasons. An unintended electric field is produced internally around the floating gate electrode when the storage of tunneled carriers in a selected memory cell transistor is in progress in the EEPROM. This unintended electric field is inevitably created by the carriers stored on the floating gate electrode. The field behaves in such a way as to cancel out the internal field produced between the floating gate electrode and the substrate by the external electric field. The internal field of the cell transistor can no longer maintain a desired strength corresponding to stored data. The strength of the internal field will decrease gradually. As a result, even if the external field is constant, the amount of stored carriers per unit time will gradually decrease with time. The presence of the nonlinearity will delay practical application of the tunnel injection writing technique to analog storage devices. For this reason, an early solution to this problem is desired ardently among those skilled in the art.

SUMMARY OF THE INVENTION

It is therefore an object of the present invention to provide a new and improved analog storage device.

It is another object of the invention to provide a new and improved analog storage device which permits the storage of an amount of carriers that accurately corresponds to analog information to be stored.

In accordance with the above objects, the present invention is directed to a specific analog storage device which employs an electrically erasable programmable transistor as its memory cell. The memory cell transistor comprises first and second current-carrying layers which are disposed spaced on a semiconductive substrate and defines a channel region therebetween, an insulated gate which at least overlaps the channel region and an insulated control gate disposed above the insulated control gate. Minority carriers are allowed to move between the channel region and the insulated gate. The amount of carriers to be stored on the insulated gate is controlled on an analog basis. A voltage is applied to the control gate, which compensates for a variation in the internal field of the transistor resulting from to the storage of carriers on the insulated gate. Thereby, the linearity of analog storage is ensured.

The foregoing and other objects, features and advantages of the invention will become apparent from the following more particular description of preferred embodiments of the invention, as illustrated in the accompanying drawings.

DETAILED DESCRIPTION OF THE PREFERRED EMBODIMENTS

Figure 1:
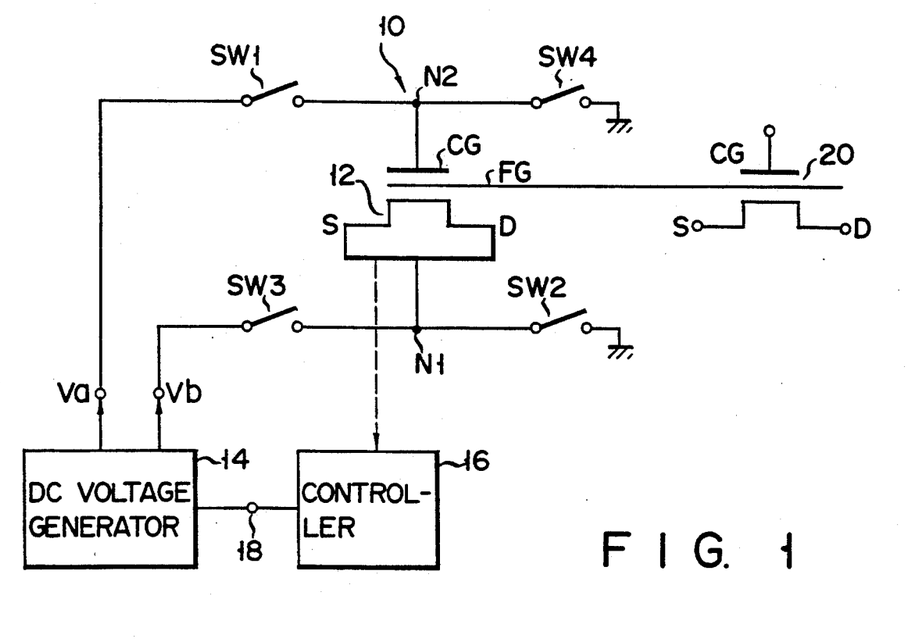
FIG. 1 is a schematic illustration of an analog storage device according to a preferred embodiment of the present invention.

Referring now to FIG. 1, an analog storage device according to a preferred embodiment of the present invention is indicated generally by "10." The analog storage device 10 includes a FATMOS programmable transistor 12, which serves as one memory cell. Transistor 12 is assumed to be of N-channel type for purposes of explanation. Transistor 12 has a couple of current-carrying electrodes, i.e., a source and a drain, which are short-circuited and constitute one signal terminal together with the substrate of the analog storage device. A circuit node N1 represents the short-circuiting of the source and drain. Node N1 might be called the "substrate terminal" below. A control gate electrode CG of transistor 1 is connected to another node N2.

A DC voltage generating circuit 14 provides suitable DC voltages required to write data into the memory cell transistor 12 or erase it. The DC voltage generator 14 is connected to a control circuit 16 at a control terminal 18. Generator 14 operates in response to a control signal output of controller 16. Generator 14 generates a write voltage Va of positive polarity at its first output, and an erase voltage Vb of positive polarity at its second output. The initial value Vp of write voltage Va in a write cycle is, for example, +20 volts and 0 volts in other cycles. The initial value of erase voltage Vb is also +20 volts and 0 volts in other cycles.

The DC voltage generating circuit 14 is associated with the memory cell transistor 12 through a switch circuit comprised of four switching devices SW. The first and second switching devices SW1 and SW2 turn on in a write cycle of the analog memory 10, while the third and fourth switching devices SW3, SW4 turn on in an erase cycle in place of the switching devices SW1, SW2. The writing voltage output Va of generator 14 is connected through switch SW1 to the node N2, which, in turn, is connected to the ground potential. Erase voltage output Vb of generator 14 is connected via switch SW3 to node N1, which, in turn, is connected to ground through switch SW2. Switching devices SW1 to SW4 may be formed of insulated gate transistors, such as MOSFETs. The switching MOSFETs of switches SW1, SW2 are externally supplied at their gate electrodes with a modulated pulse signal, which is equivalent to analog data to be written into. In a similar manner the switching MOSFETs of switches SW3, SW4 are externally supplied at their gate electrodes with a modulated pulse signal corresponding to data to be erased.

The other FATMOS transistor 20 is arranged to have a floating gate electrode which is formed integral with the floating gate electrode of FATMOS memory cell transistor 12. The structure of transistor 20 is same as that of transistor 12. Transistor 20 serves as the data output device of analog memory 20.

Figure 2:
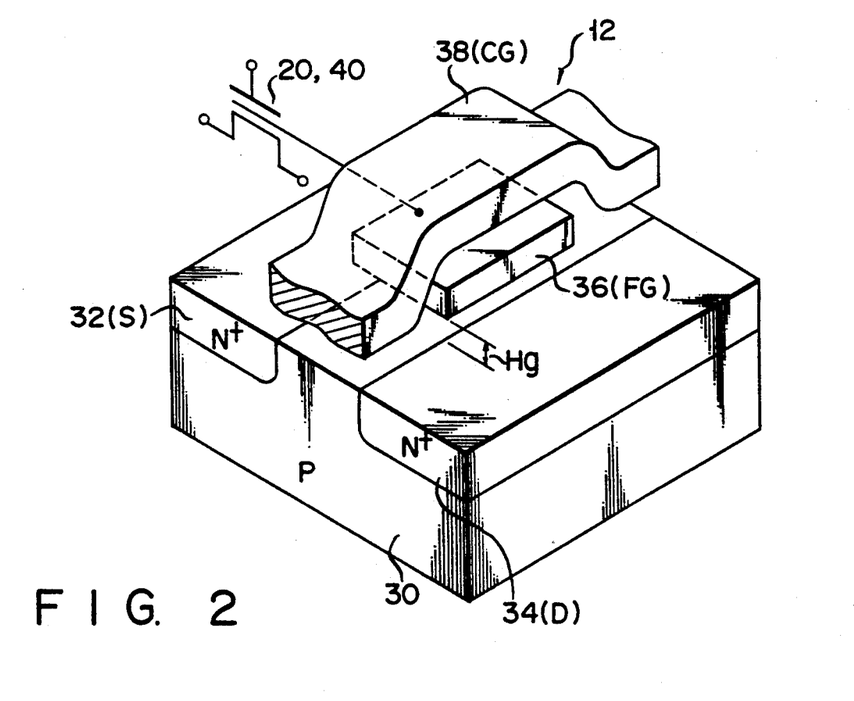
FIG. 2 is a perspective view of a memory cell transistor incorporated in the analog storage device of FIG. 1.

In FIG. 2, the structure of the memory cell transistor 12 is illustrated, wherein insulating layers, which are well known to those skilled in the art, are omitted only for the purpose of simplifying illustration. A silicon substrate 30 of P-type conductivity has a top surface. On the substrate surface heavily doped N-type layers 32, 34 are disposed apart from each other. These layers 32, 34 function as the source and drain of transistor 12, between which a channel region is defined. A gate electrode 36 is isolated from the substrate surface by a known insulating layer (not shown) of a thickness Hg and acts as a floating gate electrode FG. The other gate electrode 38 is disposed above floating gate electrode 36 so that they are isolated from each other. Layer 38 extends along the channel region defined between source 32 and drain 34. Layer 38 serves as a control gate electrode CG.

Figure 3:
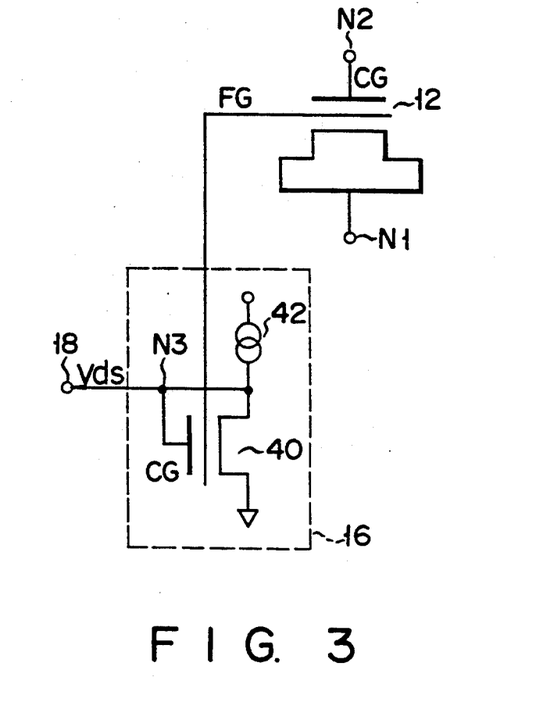
FIG. 3 is a circuit diagram of the DC voltage supply circuit of the analog storage device of FIG. 1.

The circuit arrangement of the controller 16 is shown in FIG. 3 Controller 16 includes a FATMOS transistor 40. This transistor is similar in structure to the memory cell transistor 12. The floating gate electrode of transistor 40 is also formed integral with floating gate electrode 36 (FG) of cell transistor 12. Transistor 40 functions as a monitoring device adapted to monitor a change in the threshold voltage of cell transistor 12. More specifically, the floating gate electrodes FG of transistors 12, 20, 40 may be formed of a single conductive layer that is insulated from the layer 38 of FIG. 2 and that is perpendicular thereto. The source electrode of monitoring transistor 40 is grounded. The control gate electrode of transistor 40 is short-circuited at a node N3 to its drain electrode (that is, the transistor 40 is "diode-connected"). Node N3 is connected to control terminal 18. To node N3 is connected a constant current source 42. The source-to-drain voltage Vds of the diode-connected transistor 40 is equal to its threshold voltage. Since transistors 12, 40 have a common floating gate electrode, their threshold voltages are naturally equal to each other. Therefore, at control terminal 18 appears a control voltage signal which is substantially equal to the threshold voltage (Vds=Vth) of the memory cell transistor 12.

Figure 4:
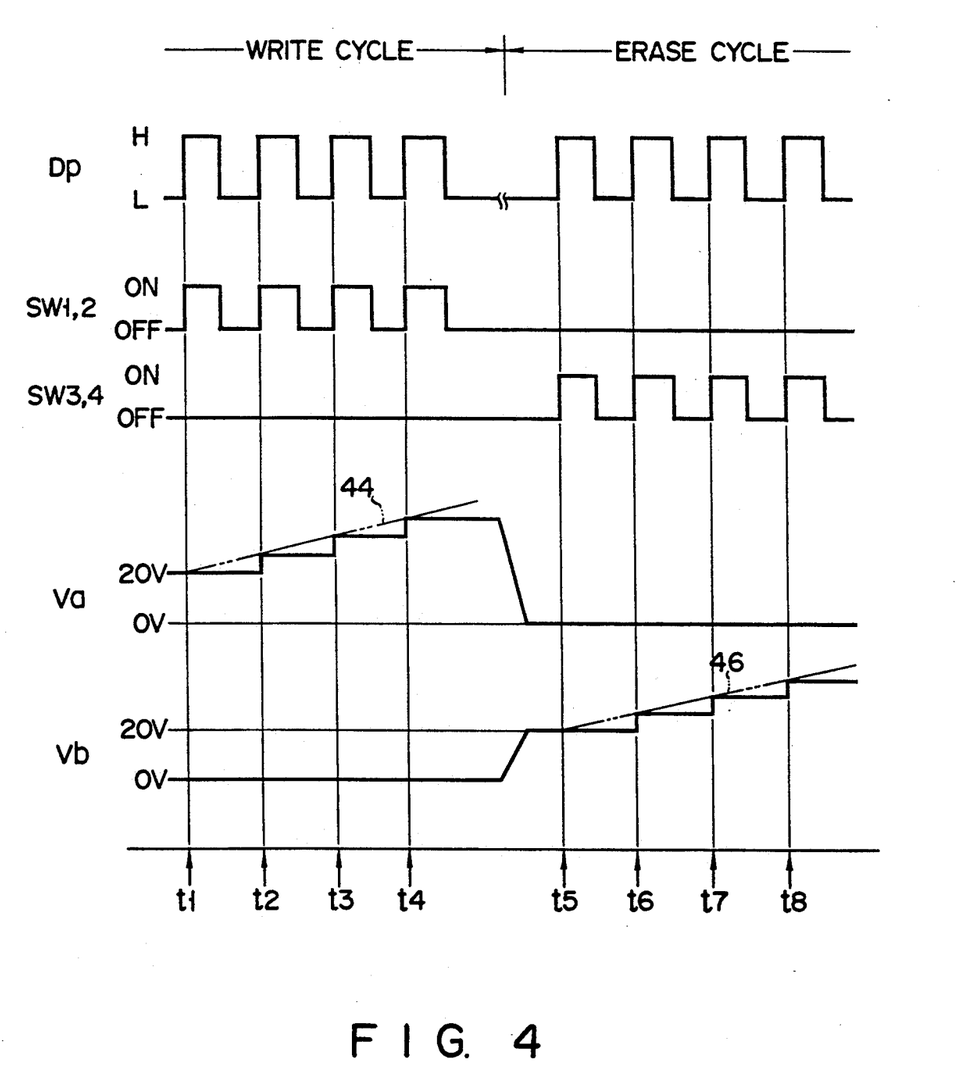
FIG. 4 is a timing diagram illustrating a pulse sequence associated with the embodiment of the FIGS. 1 through 3.

The present embodiment operates as follows. Its associated pulsing sequences are illustrated in FIG. 4. A data pulse signal Dp representing analog data to be written makes excursions between its highest potential level ("H") and lowest potential level ("L"). The period of the pulses is modulated with data. In a write cycle of the analog storage device 10, when data pulse signal Dp is applied to the control terminals (i.e., the gates of MOSFETs) of switching devices SW1, SW2, the other switching devices SW3, SW4 remain nonconductive. Node N1 is electrically disconnected from the voltage output Vb of DC voltage generator 14, while node N2 is isolated from the ground potential.

Each of the switching devices SW1, SW2 of FIG. 1 turns on and off repeatedly in response to potential excursions (toggles) made by the data pulse signal Dp. By this switching operation the DC output voltage Va of generator 14 is sampled. The signal frequency becomes high. Write pulses are applied between the control gate electrode CG of memory cell transistor 12 and substrate 30, that is, between nodes N1, N2. Application of DC output voltage Va to the control gate electrode CG of cell transistor 12 is allowed only during a short interval when the switches SW1, SW2 turn on. Voltage Va is initially +20 volts. Minority carriers (electrons) tunnel to floating gate electrode CG, so that it is charged. Thereby, write data is stored therein. The larger the analog value to be stored, the denser the switching pulses for switches SW1, SW2 and the longer the time interval during which voltage Va is applied to control gate electrode CG of cell transistor 12. Hence, a larger amount of tunneled carriers will be stored on floating gate electrode CG. On the other hand, the smaller the analog value, the coarser the switching pulses for switches SW1, SW2, and the shorter the time interval during which voltage Va is applied. In this case, floating gate electrode CG will be charged with a smaller amount of carriers.

The linearity of writing of analog data is ensured as follows. As was described in the introductory part of this specification, the threshold voltage of FATMOS cell transistor 12 increases gradually as the storage of carriers progresses in it. An increase in, the threshold voltage creates a secondary electric field which cancels out the internal field of transistor 12. The result is a reduction in the internal field. Controller 16 detects the reduction in the threshold voltage. At the output 18 of controller 16 appears a voltage Vds representing a reduced threshold voltage. In response to the output voltage Vds the DC voltage generator 14 generates an updated voltage Va, which is substantially defined by:

$$Va = Vp + a\ Vth, \tag{1}$$

where "a" is a predetermined proportional constant. Therefore, voltage Va, which is +20 volts at time t1 rises in stair steps at times t2, t3, t4 as shown in FIG. 4. An envelope line 44 joining these potential steps corresponds to equation 1. An increase in write potential Va according to equation 1 compensates for a decrease in the internal field due to the gradual increase in the threshold voltage in FATMOS cell transistor 12. Thus, the internal field can be forced to remain substantially constant during a time interval when analog data is written into transistor 12. Thus, the floating gate potential can always be kept unchanged with respect to substrate 30. This ensures the linearity of analog storage. In other words, the amount of tunneled carriers which corresponds to the write analog data can be stored on floating gate FG of transistor 12. The accuracy of analog storage can be thus improved.

In an erase cycle the analog memory 10 operates as follows. Switching devices SW1, SW2 turn off and keep nonconductive all the time. Instead, each of switches SW3, SW4 turns on and off repeatedly in response to application of a data pulse signal thereto as shown in FIG. 4. This switching operation is similar to that of switches SW1, SW2. The output voltage Vb of DC voltage generator 14 is sampled in accordance with data pulses. Thus, FATMOS cell transistor 12 receives at its substrate 30 an erase pulse signal of positive polarity while being grounded at its control gate electrode CG. Corresponding carriers tunnel back from floating gate electrode FG toward substrate 30, thus discharging the floating gate electrode.

The threshold voltage of the memory cell transistor 12 shifts undesirably in the negative direction as the erase operation proceeds, in other words, discharging of the floating gate electrode FG proceeds, thereby increasing the internal field of transistor 12. Controller 16 detects a shift of the threshold value. DC voltage generator 14 updates erase voltage Vb in accordance with an equation given by $$Vb = Vp - b\ Vth, \tag{2}$$

where "b" is a proportional constant. Voltage Vb varies in steps to follow a potential-level varying envelope indicated by a line 46 in FIG. 4. The initial potential, which is +20 volts at time t5, increases in units of a constant level at times t6, t7, t8. The increase in voltage Vb serves to make constant the internal field of transistor 12, regardless of any variations in amount of carriers stored on floating gate electrode FG. Hence, a desired amount of carriers can be removed from floating gate electrode FG in a linear manner.

The read operation of the analog memory 10 is performed by sensing a source-to-drain current flow in the memory cell transistor 12 while the control gate electrode of the output transistor 20 is externally supplied with a bias voltage of a given potential level. Since the floating gate electrodes of transistors 12, 20 are common to each other as illustrated in FIG. 1, a change in the potential at the floating gate electrode FG of transistor 12 that is caused by storing or erasing of analog data will result in an equal change in the potential at the floating gate electrode of transistor 20. By measuring the output current of transistor 20, analog stored data may be read from cell transistor 12.

Figure 5A:
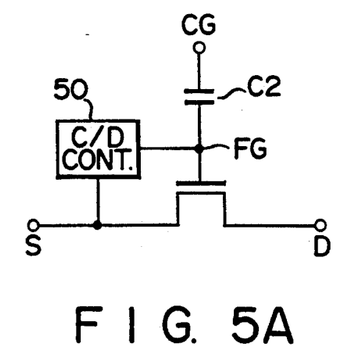
FIGS. 5A and 5B illustrate equivalent circuits of the memory cell transistor shown in FIGS. 1 to 3.
Figure 5B:
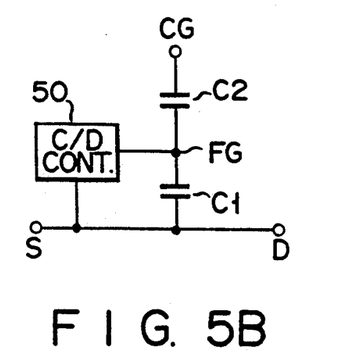

A description will be made of the principle for theoretically supporting the feature of the present invention of making the transistor internal field constant independently of charging/discharging of the floating gate electrode. Refer to FIG. 5A, in which an equivalent circuit of the FATMOS memory cell transistor 12 is illustrated. It will be appreciated that the floating gate electrode FG is capacitively coupled with the control gate electrode CG. Between floating gate electrode FG and source electrode S is arranged a charge/discharge controller. The circuit of FIG. 5A can be further simplified as shown in FIG. 5B. In FIG. 5B, source electrode S and drain electrode D are electrically short-circuited. Floating gate electrode FG is capacitively coupled with source and drain electrodes S, D. Let the coupling capacitance be C1. Let C2 stand for the coupling capacitance between the floating gate electrode and the control gate electrode.

With the present embodiment, in a write cycle, the substrate terminal is at ground and the positive voltage Va is applied to the control gate of the memory cell transistor, while, in an erase cycle, the control gate is at ground and the positive voltage Vb is applied to the control gate. In the following description, however, it is assumed for better understanding that, in the erase cycle as well, the substrate is at ground and a negative voltage −Vb is applied to the control gate. This is only to use the substrate potential as the reference potential in each of write and erase cycles for the sake of convenience. The relative potential relationship remains unchanged. Then the potential Vfa at the floating gate in the write cycle will be given by $$Vfa = Q/C1 + C2\ Va/(C1+C2), \tag{3}$$

where Q stands for an amount of carriers stored on the floating gate. On the other hand, the potential −Vfb at the floating gate in the erase cycle will be given by $$Vfb = Q/C1 - C2\ .\ Vb/(C1+C2). \tag{4}$$

It is to keep potentials Vfa, Vfb at the floating gate constant even if the amount of carriers stored on the floating gate varies that the present invention aims.

Apart from equations 3 and 4, when the amount of carriers on the floating gate is Q, the potential at the control gate is Vg, the potential at the floating gate is Vf and the potential at the substrate terminal is Vc, the following equation holds.

$$Q = C2(Vf - Vc) + C1(Vf - Vc), \qquad (5)$$

where the first term in the right member represents the amount of carriers on the floating gate which is one of plates forming the capacitance C2 and the second term likewise represents the amount of carriers on the floating gate which is one of plates forming the capacitance C1. If the floating gate were given no carriers by tunnel injection, the potential at the floating gate, at which the capacitances C1 and C2 are connected in series, would become a potential obtained by dividing an external voltage Vg - Vc and the amount of carriers on the floating gate would be zero. Thus, the floating gate potential Vf in equation 5 means that the potential obtained by dividing the externally applied voltage has a value modulated with the amount Q of carriers stored on the floating gate. Rewriting equation 5 as Vc=0 yields $$Vg = (1 + C1/C2)Vf - Q/C2. \qquad (6)$$

Consider an MOS transistor which uses the floating gate of the memory cell transistor as its gate electrode, and assume that the MOS transistor has a threshold voltage of Vtf. The memory transistor turns on when Vf=Vtf in equation 6. Thus, the control gate potential Vg when the memory transistor turns on is equal to the threshold voltage Vth. Hence, $$Vth = (1 + C1/C2)Vtf - Q/C2. \qquad (7)$$

Assuming that the threshold voltage of the MOS transistor using the floating gate as its gate electrode is very small, say, Vtf=0, then the threshold voltage Vth will be given by $$Vth = -Q/C2. \qquad (8)$$

This equation means that Vth is proportional to the carrier storage amount Q on the floating gate, more specifically, that Vth=0 when Q=0 and Vth increases in the positive direction in proportion to Q as electrons are injected.

Then, substituting equation 8 into equations 3 and 4 gives, in the write cycle, $$Va = \{(C1 + C2)/C2\}(Vfa + C2\ Vth/C1) \qquad (9)$$

and, in the erase cycle, $$Vb = \{(C1 + C2)/C2\} \cdot (Vfb - C2\ Vth/C1). \qquad (10)$$

In these equations, each of the floating gate potential Vfa in the write cycle and the floating gate potential Vfb in the erase cycle is a design parameter. Substituting these values into the above equations under the conditions in which they are constant independently of variations in amount of carriers gives Va and Vb which satisfy such conditions. For example, consider the case where Vfa=Vfb=4 V. Moreover, assume that the device-form-dependent capacitances C1 and C2 are C1=100 pF and C2=25 pF. Then substituting these values into equations 9 and 10 yields, in the write cycle, $$Va \approx 20 + 1.25\ Vth \approx 20 + Vth \qquad (11)$$

and, in the erase cycle, $$Vb \approx 20 - 1.25\ Vth \approx 20 - Vth. \qquad (12)$$

From the foregoing it will be appreciated that, by variably controlling the applied potential Va at the time of writing and the applied potential Vb at the time of erasing in accordance with variations in the threshold voltage Vth, writing and erasing can be performed under the condition in which the voltage between the floating gate and the substrate terminal when a pulse voltage is applied is constant, i.e., the tunnel current is always constant.

Figure 6:
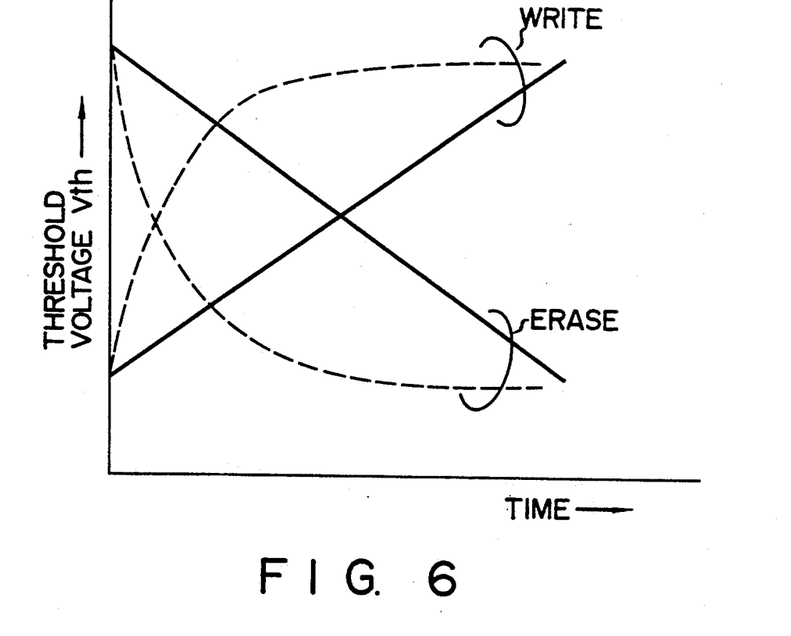
FIG. 6 is a graph illustrating changes of the threshold voltage of the memory cell transistor with time at the time of writing and erasing of information in the analog storage device of the present invention.

FIG. 6 is a graph illustrating variations in the threshold voltage Vth of a memory cell transistor according to the embodiment with respect to the write and erase pulse application time. In the figure, solid lines indicate characteristics of the embodiment described above. Like characteristics when no applied voltage control is performed are also indicated by broken lines for comparison.

Figure 7:
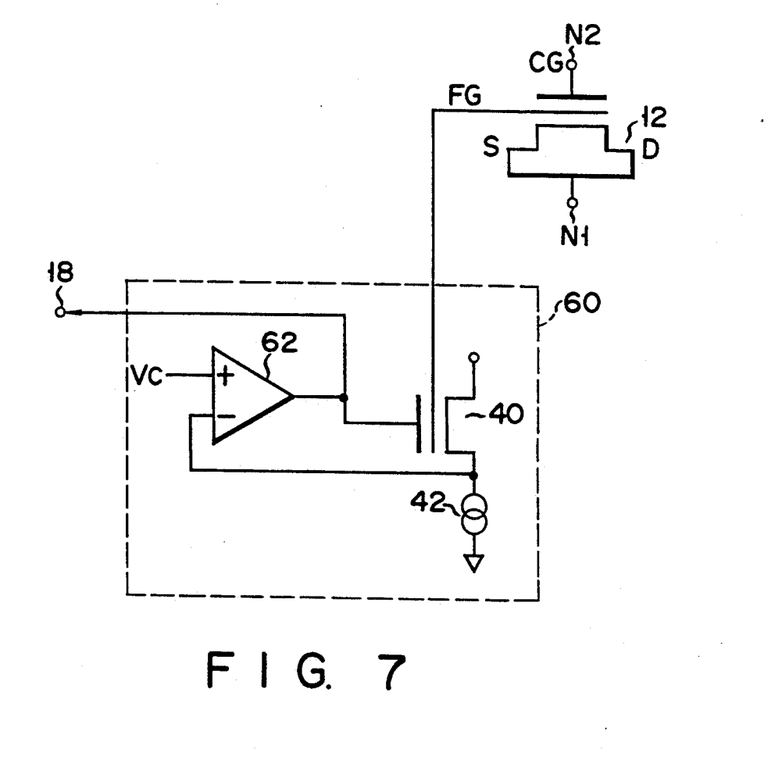
FIG. 7 is a diagram illustrating the main part of an analog storage device according to another embodiment of the present invention.

Another analog storage device is illustrated in FIG. 7. This analog storage device is similar to the analog storage device 10 of FIG. 1 with the control circuit 16 of FIG. 3 being replaced with a control circuit 60. This controller includes an operational amplifier 62 which is associated with the FATMOS monitoring transistor 40. Operational amplifier 62 has its inverting input connected to the source electrode of transistor 40 and its non-inverting input connected to receive an externally applied voltage Vc of a given magnitude. That is, a negative feedback for the amplifier is provided by the connection from the source electrode of transistor 40 to the amplifier. The output of amplifier 62 is coupled to the control gate electrode of transistor 40 and control output 18. Unlike the controller 16 shown in FIG. 3, the gate electrode of transistor 40 is not connected to its drain electrode. In addition, constant current source 42 is provided at the source electrode side of transistor 40.

The use of the controller 60 of FIG. 7 allows the linearity of analog storage to be achieved even if the threshold voltage of the FATMOS cell transistor 12 shifts negatively. More specifically, the non-inverting input voltage Vc of operational amplifier 62 and constant current source 42 are adjusted such that the gate-to-source voltage of transistor 40 becomes equal to the threshold voltage of transistor 12. Thereby, the output voltage of operational amplifier 62 maintains a constant potential level, Vc +Vth, even if the threshold voltage Vth of transistor 40 varies. The reason is as follows: when the threshold voltage of transistor 40 varies with the varying threshold voltage of memory cell transistor 12, the source voltage of transistor 40 will vary to deviate from Vc, but amplifier 62 controls the variation in the source voltage. Controller 60 may operate properly regardless of whether the threshold voltage of transistor 40 is of positive polarity or of negative polarity.

Figure 8:
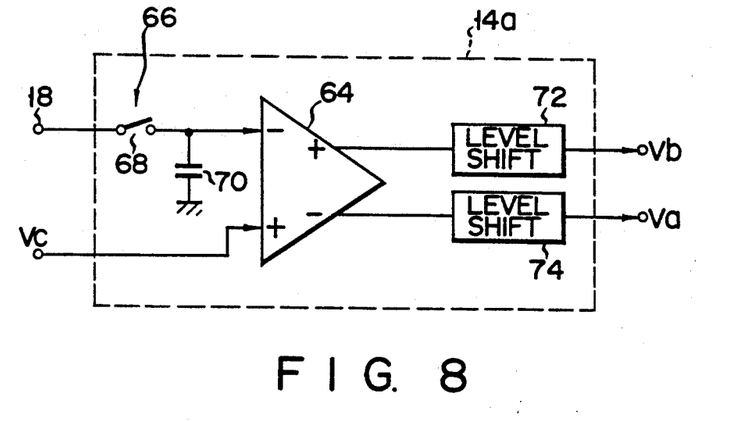
FIG. 8 is a diagram illustrating an internal arrangement of a dc voltage generator suited for association with the control circuit of FIG. 7.

Referring now to FIG. 8, there is illustrated an internal arrangement of the DC voltage generator 14a that is suited for association with analog-storage controller 60. Generator 14a includes an operational amplifier 64. The inverting input of amplifier 64 is coupled to control signal input 18 via a sampling circuit 66 composed of a switching device 68 and a capacitor 70. Switch 68 may be formed of an insulated gate transistor such as a MOS-FET. The non-inverting input of amplifier 64 is connected to voltage Vc. The positive-polarity output of amplifier 64 is connected to write voltage Va via a first level shift circuit 72. The negative-polarity output of amplifier 64 is connected to erase voltage Vb via a second level shift circuit 74.

The combined use of the controller 60 of FIG. 7 and the DC voltage generator 14a of FIG. 8 permits the control signal output 18—i.e., the potential at the control gate electrode of the monitoring transistor 40—to go to Vc+Vth. When switch 68 turns off, voltages Vc+Vth and Vc are applied to the inverting input and the non-inverting input, respectively, of operational amplifier 64. Let the gain of amplifier 64 be G. Then its positive-polarity output will be at G . Vth and its negative-polarity output will be at G . Vth. Let amounts of shift in level shift circuits 72, 74 be Vd1, Vd2, respectively. Then voltages Va, Vb will be defined by $$Va = Vd1 + G \cdot Vth,$$

$$Vb = Vd2 - G \cdot Vth.$$

Thus, suitable write and erase voltages are obtained. Note that sampling circuit 66 is forced to a hold mode at the times of writing and erasing of analog information, thereby allowing measurements of the threshold voltage of memory cell transistor 12 only during intervals when write pulses (or erase pulses) are not applied.

Figure 9:
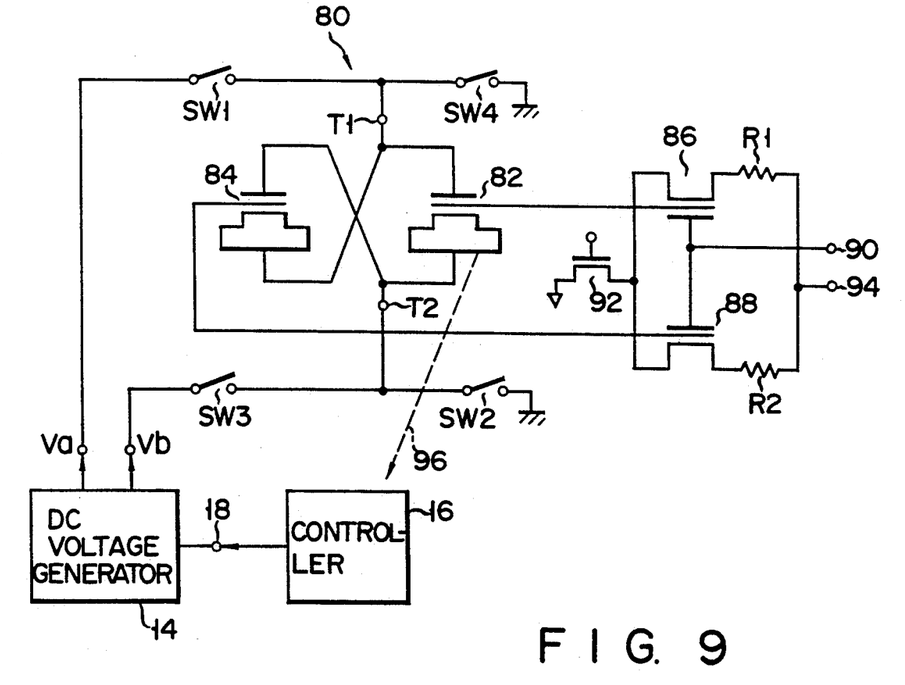
FIG. 9 is a schematic illustration of an analog storage device according to still another embodiment of the present invention.

An analog storage device 80 according to still another embodiment of the present invention is illustrated in FIG. 9, which is similar to analog storage device 10 of FIG. 1 with each memory cell being composed of a couple of FATMOS transistors 82, 84, and output transistors 86, 88 being associated with transistors 82, 84, respectively.

More specifically, first memory cell transistor 82 and its associated output transistor 86 are associated with switching devices SW1, SW4, DC voltage generator 14 and controller 14 in the same manner as transistors 12, 30 of FIG. 1 are associated with these circuit components SW1 to SW4, 14, 16. The first and second memory cell transistors 82, 84 are cross-coupled with each other such that the substrate terminal of transistor 84 is connected to the control gate electrode of transistor 82 and to a first cell terminal T1, and the substrate terminal of transistor 82 is connected to the control gate electrode of transistor 84 and to a second cell terminal T2. The second output transistor 88 has a floating gate electrode formed integral with that of transistor 84. The control gate electrodes of first and second output transistors 86, 88 are connected together to a read control signal input 90. These control electrodes may be connected to separate read control inputs. The source electrodes of transistors 86, 88 are connected together to a current source device 92 such as an MOSFET. The drain electrodes of transistors 86, 88 are connected to a read terminal 94 through resistive elements R1, R2. As can be seen, transistors 86, 88 are connected in a differential-circuit configuration.

The cross-coupled FATMOS cell transistors 82 and 84 of FIG. 9 provide a complementary memory cell structure. Of these transistors the transistor 82 serves as a main memory cell transistor, while the other transistor 84 serves as an auxiliary memory cell transistor. In this embodiment, controller 66, as indicated by an arrow 96, performs the above-described functions of monitoring the threshold voltage and making internal field constant on main cell transistor 82. When cell transistor 82 is written with data, the other transistor 84 is erased. When transistor 82 is erased, transistor 84 is written with data. The tunnel charging/discharging operations at the floating gate electrodes of transistors 82, 84 are complementary to each other. The manner of controlling the linearity of analog storage for transistor 82 is the same as was described in connection with FIG. 4.

In the above embodiments, the memory cell transistor 12 (or 82), the monitoring transistor 40 and the output transistor 20 are formed integral with one another in their floating gate electrodes. This configuration provides the above-described merits, but on the other hand, in a practical application, there is a likelihood of giving rise to the following problem: when the write voltage Va or erase voltage Vb is applied to the cell transistor, a voltage developed at its floating gate electrode FG will be applied to the other transistors 20 and 40 as well as it is and consequently an undesired tunnel current flow will be produced in these transistors. Fortunately, this problem can be solved successfully by one (or combinations) of four methods described below.

Figure 10:
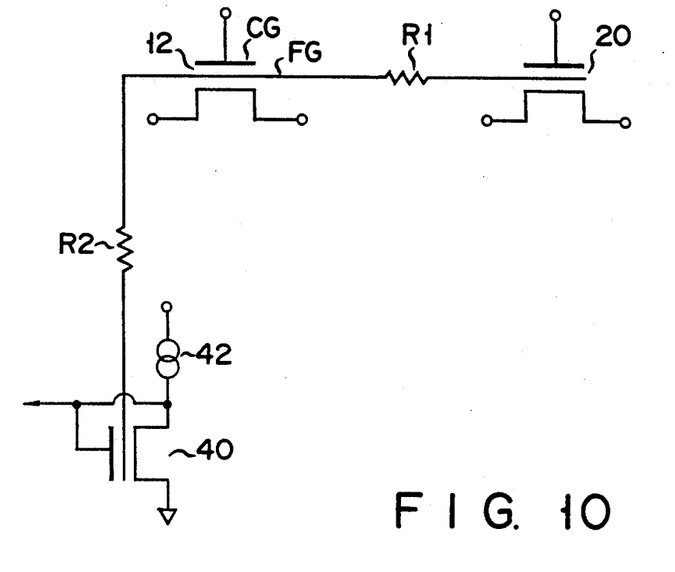
FIGS. 10 and 11 illustrate modifications of the embodiments of the present invention.

The first method is, as indicated in FIG. 10, to interpose resistive elements R1 and R2 between memory cell transistor 12 and output transistor 20 and between memory cell transistor 12 and monitoring transistor 40, respectively. The addition of such resistive elements serves to electrically weaken the propagation of the floating gate potential of transistor 12 which is being written into (or erased) to transistors 20, 40. The, the generation of tunnel current in these transistors can thus be suppressed. Carriers on the floating gate electrode FG of the transistor 12 will diffuse into transistors 20, 40 at a relatively short time after the termination of a write (or erase) cycle. Consequently, all the transistors 12, 20, 40 becomes equal to one another in floating gate potential. Thus, the presence of resistive elements R1, R2 has no seriously adverse effect on the sensing and monitoring operations of the analog storage device.

The second method is to apply a bias voltage to the transistors 20, 40 while memory cell transistor 12 is being written with data or erased. The bias voltage a suitable magnitude selected to prevent tunnel currents from being produced in those transistors.

The third method, which is a slightly strange approach, is to cause an equal amount of tunnel current to flow into each of transistors 20, 40 while cell transistor 12 is written with data or erased. By positively placing transistors 20, 40 in the same tunnel current flow state as in memory cell transistor 12, the imbalance of tunnel current flow among transistors 12, 20, 40 can be eliminated.

Figure 11:
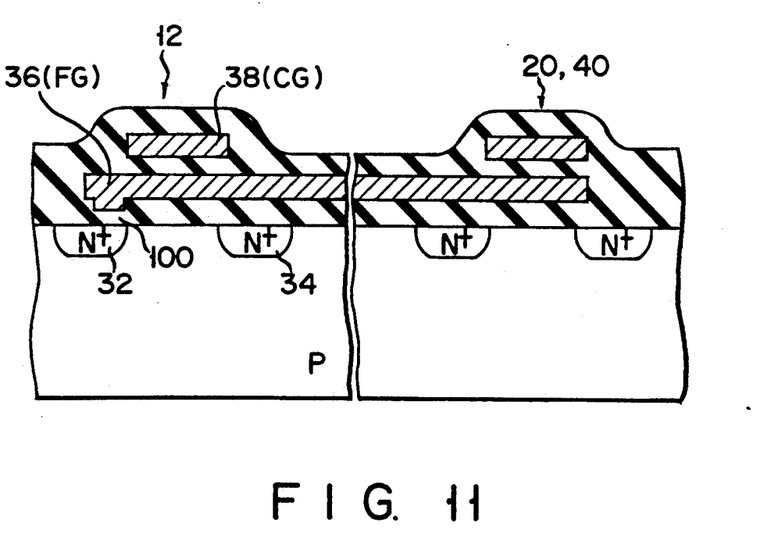

The fourth method is, as shown in FIG. 11, to use as the memory cell transistor 12 a FATMOS transistor which is distinct in structure from output transistor 20 and monitoring transistor 40. That is, the floating gate electrode 36 of transistor 12 is formed partly thick at its portion that overlaps source electrode 32, so that a thin insulating film portion 100 is formed in the underlying gate insulating film. The gate insulating film of transistors 20, 40 is made uniform in thickness. The thin gate insulating film portion 100 of transistor 12 functions as the tunnel region. Transistor 12 and the other transistors vary in the tunnel current conditions, whereby the above problem is solved.

Figure 12:
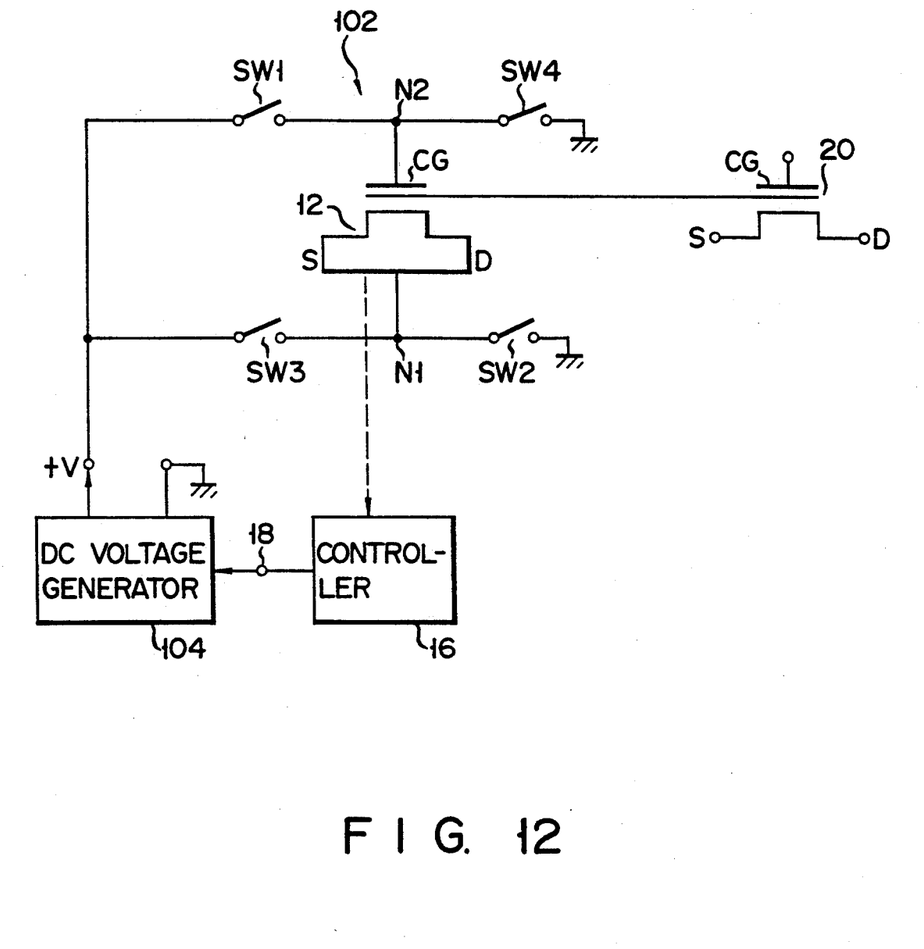
FIG. 12 is a circuit diagram of a slight modification of the embodiment of FIG. 1.

A slight modification of the embodiment shown in FIG. 1 is illustrated in FIG. 12. This analog storage device 102 differs from the embodiment of FIG. 1 only in that the DC voltage generator 12 has been replaced with a DC voltage generator 104 which generates only one positive voltage. DC voltage generator 104 constantly generates at its first output a positive voltage +V under the control of controller 16. The second output thereof is connected to ground. By suitably modifying the switching control of switching devices SW1 to SW4, the voltage +V can be employed as a write voltage Va and an erase voltage Vb with different polarities of application.

The present invention is not limited to the above-described specific embodiments and may be practiced or embodied in still other ways without departing from the spirit or essential character thereof. For example, depending on the circumstances, the data reading transistor used in the previously described embodiments might not be required. For, an equivalent reading operation can be performed by changing circuit switching with a memory cell transistor only.

What is claimed is:

1. An electrically erasable programmable transistor comprising:
   a substrate;
   first and second current-carrying layers spaced apart from each other on said substrate for defining a channel region therebetween;
   an insulated charge storage layer which at least overlaps said channel region;
   a control gate insulatively disposed above said charge storage layer; and
   control means for allowing carries to move between said channel region and said charge storage layer, for controlling an amount of carriers stored on said charge storage layer so as to be indicative of analog information, and for forcing an internal electric field of said transistor to be substantially constant while the carriers are stored on said charge storage layer, by detecting a variation on a threshold voltage of said transistor due to a variation in an amount of carriers stored on said charge storage layer, and by providing said control gate with a voltage for compensating the variation of the threshold voltage.

2. A transistor according to claim 1, wherein said control means comprises:
   monitor means for monitoring variations in the threshold voltage of said transistor to generate an electrical signal; and
   voltage generating means responsive to said electrical signal, for generating a bias voltage which potentially varies to compensate for variations in said threshold voltage.

3. A transistor according to claim 2, wherein said control means further comprises:
   voltage applying means for providing said control gate with said bias voltage for enough time for said charge storage layer to store an amount of carriers corresponding to a desired analog value of the analog information.

4. A transistor according to claim 3, wherein said monitor means includes a transistor which is substantially same in structure as said programmable transistor and which has an insulated gate connected to said charge storage layer of said programmable transistor.

5. A transistor according to claim 4, wherein said voltage generating means includes a DC voltage generating circuit, and said voltage applying means includes a plurality of switch devices.

6. An electrically erasable programmable transistor for use in an analog memory system, said transistor comprising:
   first and second current-carrying layers spaced apart from each other in a substrate for defining a channel region therebetween;
   a floating gate which overlies said channel region;
   a control gate insulatively disposed above said floating gate;
   program means for potentially controlling said control gate to cause said floating gate to store an electric charge indicative of an analog information; and
   floating-gate potential controller means for detecting a variation in a threshold voltage of said transistor due to the storage of charge on said floating gate, and for providing said control gate with a voltage potentially modified to compensate for the variation in the threshold voltage to force said floating gate to remain substantially constant in potential so that an electric field internally caused in said transistor is kept constant while the charge is stored on said floating gate.

7. A transistor according to claim 6, wherein said programmable transistor includes a floating gate tunneling metal oxide semiconductor field effect transistor.

8. A transistor according to claim 7, wherein said floating-gate potential controller means comprises:
   monitor means for monitoring the threshold voltage of said transistor and for generating a monitor signal indicative of a presently detected threshold voltage, said monitor means including a floating-gate tunneling metal oxide semiconductor field effect transistor having a floating gate coupled to said floating gate of said programmable transistor.

* * * * *